US012020740B2

(12) United States Patent
Vogelsang

(10) Patent No.: US 12,020,740 B2
(45) Date of Patent: Jun. 25, 2024

(54) MEMORY DEVICE HAVING NON-UNIFORM REFRESH

(71) Applicant: Rambus Inc., San Jose, CA (US)

(72) Inventor: Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/973,241

(22) PCT Filed: May 25, 2019

(86) PCT No.: PCT/US2019/039050
§ 371 (c)(1),
(2) Date: Dec. 8, 2020

(87) PCT Pub. No.: WO2020/005985
PCT Pub. Date: Jan. 2, 2020

(65) Prior Publication Data
US 2021/0241822 A1 Aug. 5, 2021

Related U.S. Application Data

(60) Provisional application No. 62/690,091, filed on Jun. 26, 2018.

(51) Int. Cl.
*G11C 11/406* (2006.01)
(52) U.S. Cl.
CPC ... *G11C 11/40615* (2013.01); *G11C 11/40611* (2013.01); *G11C 11/40626* (2013.01)

(58) Field of Classification Search
CPC ........ G11C 11/40615; G11C 11/40626; G11C 11/40611
See application file for complete search history.

(56) References Cited

U.S. PATENT DOCUMENTS

| 6,215,714 B1 | 4/2001 | Takemae et al. |
| 6,226,709 B1 | 5/2001 | Goodwin et al. |
| 6,930,943 B2 | 8/2005 | Kim |
| 7,043,598 B2 | 5/2006 | Wu et al. |
| 7,158,434 B2 | 1/2007 | Hokenmaier |

(Continued)

FOREIGN PATENT DOCUMENTS

| CN | 1551231 A | 12/2004 |
| CN | 1751356 A | 3/2006 |

(Continued)

OTHER PUBLICATIONS

Jamie Liu et al., "RAIDR: Retention-Aware Intelligent DRAM Refresh"; Proceedings of the 39th Annual International Symposium on Computer Architecture, Jun. 9-13, 2012, Portland, Oregon. 12 pages.

(Continued)

*Primary Examiner* — Sultana Begum
(74) *Attorney, Agent, or Firm* — Lance Kreisman; Peninsula Patent Group

(57) ABSTRACT

An integrated circuit memory device includes an array of storage cells configured into multiple banks. Each bank includes multiple segments. Register storage stores per-segment values representing per-segment refresh parameters. Refresh logic refreshes each segment in accordance with the corresponding per-segment value.

16 Claims, 3 Drawing Sheets

(56) References Cited

U.S. PATENT DOCUMENTS

| | | | |
|---|---|---|---|
| 7,180,806 | B2 | 2/2007 | Ikeda et al. |
| 7,180,808 | B2 | 2/2007 | Choi et al. |
| 7,236,416 | B2 | 6/2007 | Walker |
| 7,342,841 | B2 | 3/2008 | Jain et al. |
| 7,710,809 | B2 | 5/2010 | Ahn et al. |
| 8,347,027 | B2 | 1/2013 | Gray et al. |
| 8,630,141 | B2 | 1/2014 | Tamlyn |
| 8,799,566 | B2 | 8/2014 | Kilmer et al. |
| 8,873,326 | B2 | 10/2014 | Lee |
| 9,007,862 | B2 | 4/2015 | Ware et al. |
| 9,030,904 | B2 | 5/2015 | Lee |
| 9,159,397 | B2 | 10/2015 | Boehm et al. |
| 9,355,704 | B2 | 5/2016 | Lai |
| 10,297,307 | B1* | 5/2019 | Raad .................. G11C 11/1675 |
| 2002/0196692 | A1* | 12/2002 | Fiscus .................. G11C 5/147 |
| | | | 365/222 |
| 2003/0043680 | A1* | 3/2003 | Akiba ................. G11C 11/4074 |
| | | | 365/227 |
| 2004/0196718 | A1* | 10/2004 | Poechmueller ....... G11C 11/406 |
| | | | 365/236 |
| 2005/0060488 | A1 | 3/2005 | Poechmueller |
| 2006/0221741 | A1 | 10/2006 | Jain et al. |
| 2007/0091707 | A1 | 4/2007 | Hidaka |
| 2007/0133338 | A1 | 6/2007 | Hoffmann |
| 2008/0092016 | A1 | 4/2008 | Pawlowski |
| 2009/0316499 | A1 | 12/2009 | Hidaka |
| 2010/0332943 | A1 | 12/2010 | D'Abreu et al. |
| 2013/0279283 | A1 | 10/2013 | Seo et al. |
| 2014/0112086 | A1 | 4/2014 | Park et al. |
| 2014/0254298 | A1* | 9/2014 | Dally .................. G11C 11/406 |
| | | | 365/222 |

FOREIGN PATENT DOCUMENTS

| | | | |
|---|---|---|---|
| CN | 101154439 | A | 4/2008 |
| CN | 102272849 | A | 12/2011 |
| CN | 102326205 | A | 1/2012 |
| CN | 10337695 | A | 10/2013 |
| CN | 103578526 | A | 2/2014 |
| CN | 104050049 | A | 9/2014 |
| KR | 102145401 | B1* | 3/2015 ........... G11C 7/1051 |

OTHER PUBLICATIONS

Notification of Transmittal of the International Search Report and the Written Opinion of the International Searching Authority, or the Declaration with dated Sep. 13, 2019 re: Int'l Appln. No. PCT/US2019/039050. 13 Pages.

EP Extended European Search Report with dated Feb. 24, 2022 re: EP Appln. No. 19826773.4. 8 pages.

EP Response filed on Sep. 21, 2022 in Response to the Extended European Search Report dated Feb. 24, 2022 and the Official Communication Pursuant to Rules 70(2) and 70a(2) EPC dated Mar. 15, 2022 in EP Appln. No. 19826773.4. 18 pages.

* cited by examiner

MEMORY DEVICE HAVING NON-UNIFORM REFRESH

CROSS REFERENCES TO RELATED APPLICATIONS

This application is a national stage application of international application number PCT/US2019/39050, filed Jun. 25, 2019, which claims the benefit of U.S. Provisional Application No. 62/690,091, filed Jun. 26, 2018, all of which are incorporated by reference herein in their entirety.

TECHNICAL FIELD

The disclosure herein relates to memory systems, and more specifically to memory devices, controllers and methods for varying refresh rates on a per-segment basis.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of memory devices, controllers, associated methods and integrated circuits are disclosed herein. One embodiment of a memory device includes an array of storage cells configured into multiple banks. Each bank includes multiple segments. Register storage stores per-segment values representing per-segment refresh rates. Refresh logic refreshes each segment in accordance with the corresponding per-segment value. By non-uniformly varying the per-segment refresh rates based on acceptable error rates associated with the data stored in each segment, significant power savings attributable to refresh operations may be realized.

Specific embodiments described herein provide apparatus and methods that vary refresh rates on a per-segment basis, and in accordance with pre-specified error criteria associated with data stored in each segment. Refresh rates may thus be increased or decreased to correspondingly refresh storage cells in a manner that tightens or loosens read data errors attributable to refresh operations.

Figure 1:
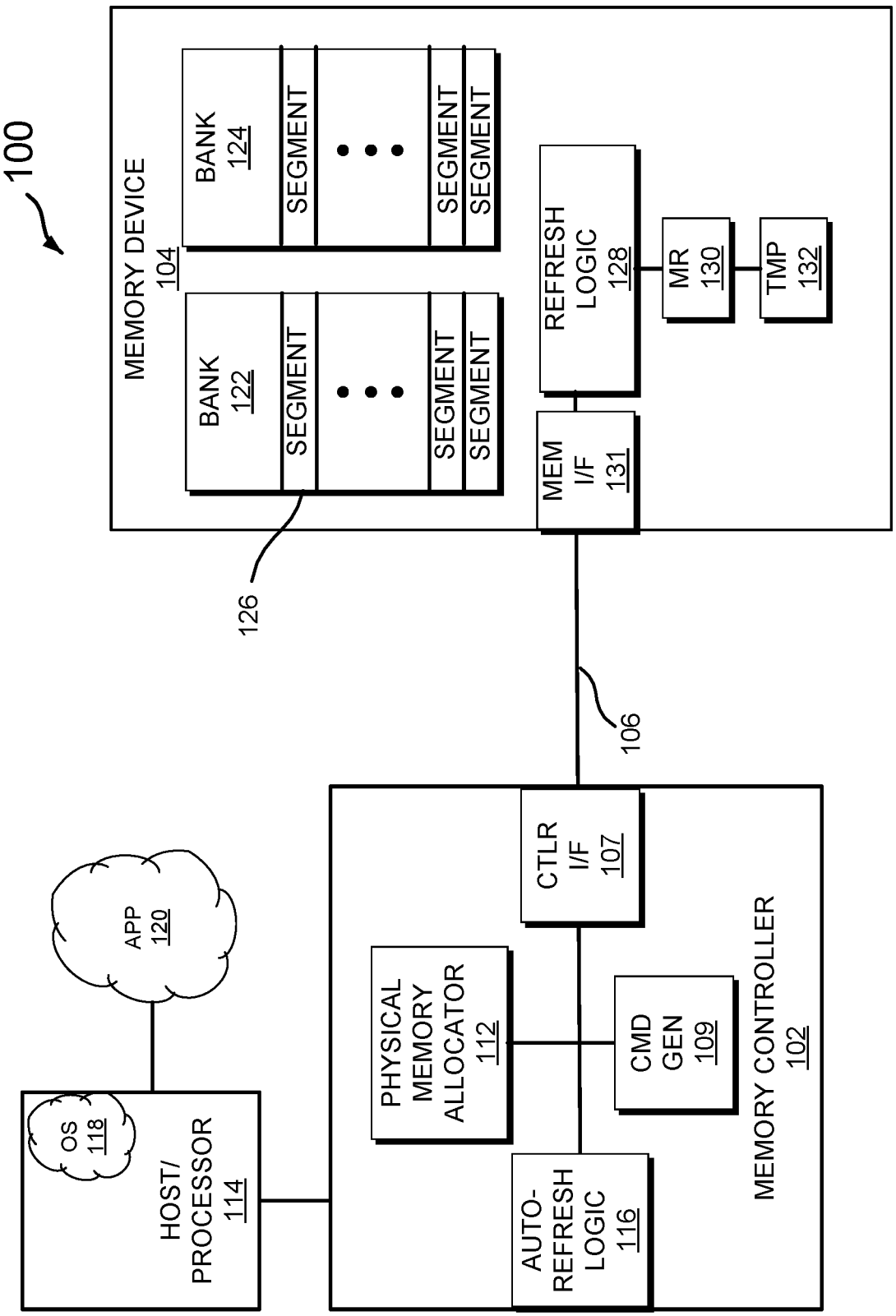
FIG. 1 illustrates one embodiment of a memory system that employs non-uniform refresh.

With reference to FIG. 1, a memory system, generally designated 100, is shown that includes a memory controller 102 coupled to a memory device 104 via bus 106. For one embodiment, the memory controller is a DRAM controller, with the memory device realized as a dynamic random access (DRAM) memory device. In some embodiments, the memory controller and memory device may be embodied as integrated circuits, or chips. Other embodiments may employ the memory controller as a circuit in a general purpose processor. Specific embodiments for the DRAM memory controller and memory device may be compliant with various DRAM standards, including double data rate (DDR) variants, low power (LPDDR) versions, and graphics (GDDR) types. Other embodiments may include multi-chip modules that, for example, employ stacked memory die, or stacked packages. Such embodiments may be used with memory modules. Additional embodiments may stack memory die and logic die together in a common package, or in separate packages stacked upon each other.

Further referring to FIG. 1, the memory controller 102 includes a controller interface 107 for transferring data, command and control signals between the memory controller and the memory device 104. Command generation circuitry 109 generates read/write and mode register write (MRW) commands for transmission to the memory device. For one embodiment, explained below, the command generation circuitry 109 generates MRW commands for storing values associated with per-segment refresh rates into a mode register on the memory device. A physical memory allocator 112 determines bank and segment addresses for physical memory corresponding to memory requested by a Host/Processor 114. The memory controller may also include auto-refresh logic 116 to generate refresh commands that are externally applied to the DRAM memory device during auto-refresh operations. Auto-refresh occurs while the memory system is in an active state to support an actively operating electronic device.

With continued reference to FIG. 1, the Host/Processor 114 may take the form of a general purpose processor that responds to instructions generated by Operating System (OS) 118. The OS, in turn, allocates logical memory in response to memory requested by a given Application 120, and for one embodiment, generates tags for allocated memory as more fully described below.

Further referring to FIG. 1, the memory device 104 includes an array of volatile storage cells that are, in one embodiment, organized into banks 122 and 124. Each bank, in turn, is organized into multiple addressable segments 126. For one embodiment, each memory device includes eight banks, with each bank having eight segments. The memory device may include any memory integrated circuit (IC) chip having volatile storage cells that maintain a given charge state through periodic refresh operations.

With continued reference to FIG. 1, to carry out refresh operations on a per-segment basis, one embodiment of the memory device incorporates refresh logic 128. Refresh logic 128 controls the internal DRAM operation for self-refresh, auto refresh or both. In one embodiment, refresh logic 128 contains a refresh counter that keeps track of the next address to be refreshed. Mode register circuitry 130 provides register storage for per-segment refresh rate values based on the acceptable data error thresholds or BERs generated by the Application 120 and OS 118. The refresh logic 128 accesses the register values when carrying out per-segment non-uniform self-refresh operations.

Further referring to FIG. 1, the memory device 104 includes a memory interface 131 that receives data, command and control signals from the memory controller 102. As noted above, for one embodiment, the controller interface 107 on the memory controller transfers each per-segment refresh rate value for a given segment to the memory interface 131 with an accompanying mode register write (MRW) command. In response to the MRW commands, the per-segment refresh rate values are loaded and stored in the mode register circuitry 130.

For some embodiments, the memory device 104 may employ temperature detection circuitry 132 such as a temperature sensor to operate consistent with Temperature Compensated Self-Refresh (TCSR) techniques to assist in the per-segment non-uniform self-refresh operations described herein. Other embodiments may employ the temperature detection circuitry on the memory controller 102. For one embodiment, a global refresh rate for the memory device segments may be established via the TCSR methodology, with per-segment non-uniform refresh rate multipliers stored in the mode register circuitry 130 as the per-segment refresh rate values selectively applied to the global refresh rate for finer refresh rate control.

In operation, "per-segment non-uniform refresh" operations are managed by the memory system of FIG. 1, in both self-refresh and auto-refresh situations, although most of the discussion herein focuses on embodiments that vary refresh rates on a per-segment basis during self-refresh operations. Generally, auto-refresh takes place during active operation of an electronic device, while self-refresh takes place while the electronic device is in a "sleep" or inactive mode to reduce power dissipation. Self-refresh is timed by the DRAM itself independent of the memory controller using, for example, a ring oscillator and counter to generate row addresses on chip. Auto-refresh is triggered on a per command basis by the controller where each auto-refresh command would indicate to the DRAM to refresh one or more rows.

An electronic device that utilizes the memory system of FIG. 1 generally runs one or more Applications for a user. Prior to actual operation, a pre-configuration procedure is carried out to initialize and optimize memory system settings for the Application. A given Application may need to load different types of data into the memory device 104, such as program code and/or bulk data utilized by the Application. In some situations, it may be desirable to have a very low error threshold, such as a bit-error-rate (BER), associated with the program code data to ensure proper program execution. Bulk data such as image or audio data, on the other hand, may in some occasions be managed with higher error rates while still enabling acceptable use of the Application.

Figure 2:
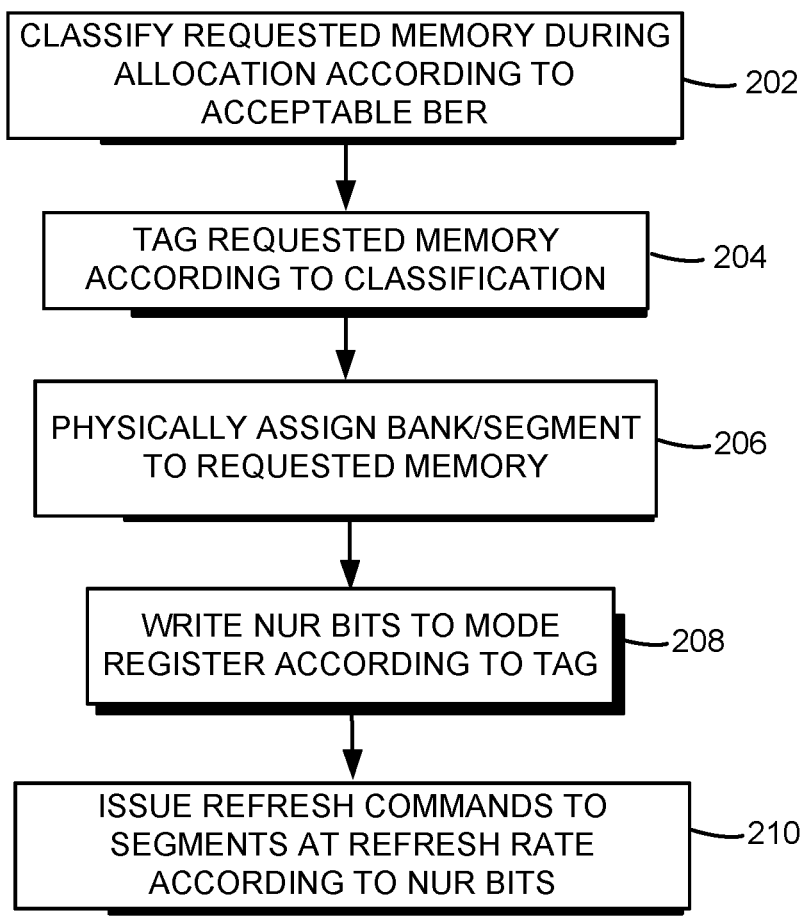
FIG. 2 illustrates a flowchart that shows one example of operations carried out during operation of the memory system of FIG. 1.

Referring now to FIG. 2, in one embodiment, to manage classifying different types of data with different acceptable BER parameters, the OS 118 and Application 120 cooperate to classify requested memory during memory allocation according to an acceptable data error threshold, such as a BER, at 202, and tag the requested memory according to the classification, at 204. The memory controller 102 receives the allocation information from the Host/Processor 114, and generates physical memory assignments in terms of banks and segment addresses, at 206. The memory controller also writes mode register bit information for non-uniform refresh operations in the memory device mode register, at 208. The memory controller also issues auto-refresh commands during operation at 210. In one embodiment, the rate of the memory controller issuing auto-refresh commands is the same as when used without non-uniform refresh (NUR), in another embodiment the memory controller uses a different rate of issuing auto refresh commands when using NUR.

Figure 3:
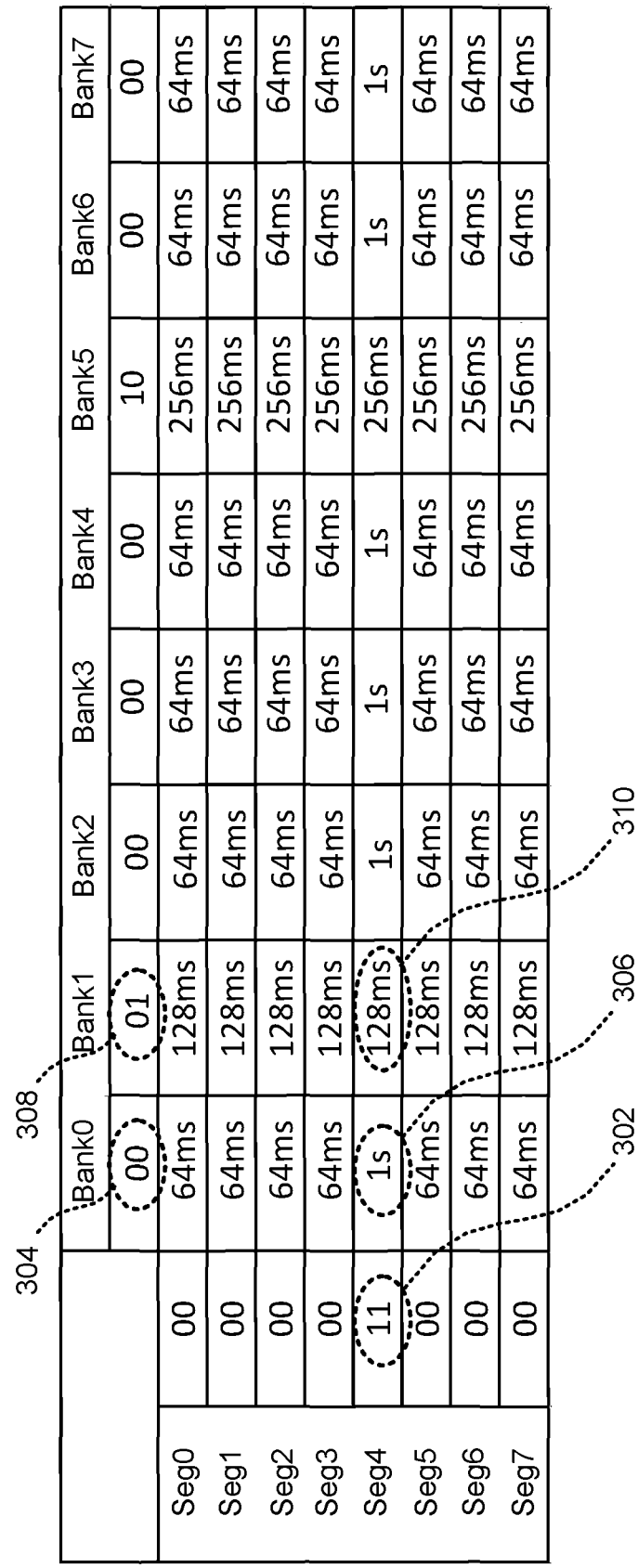
FIG. 3 illustrates a code/decode table for one embodiment of mode refresh bit coding/decoding for the memory system of FIG. 1.

FIG. 3 illustrates an exemplary mode register decoder diagram for mode register bits that are engaged in per-segment refresh operations in accordance with one embodiment. The diagram is organized into rows that represent eight segments, labeled S0-S7, and columns that represent eight banks, labeled B0-B7. Each bank and segment includes a set of mode bits to indicate a refresh parameter value, such as an absolute refresh rate, or a modifier value to modify a global refresh rate. For one embodiment, the bank/segment bits are set according to the following code:
00: Bank or segment are refreshed at a nominal value (such as 64 ms).
01: Refresh of bank or segment is 2× longer than nominal (128 ms).
10: Refresh of bank or segment is 4× longer than nominal (256 ms).
11: Refresh of bank or segment is 8× longer than nominal (1s).

Where both bank and segment bits show a code specifying a refresh rate other than the nominal rate, the bank bit code supercedes the segment code. While a two-bit coding is shown and described herein for one specific embodiment, additional bits may be provided to provide even finer granularity. For example, additional bits may specify additional refresh rates/modifiers and/or specify individual segments.

Further referring to FIG. 3, as an example, a first portion of the diagram, at 302, shows a segment code of "11" for the fifth segment S4. A nominal code of "00" for bank B0, at 304, specifies a refresh rate of 64 ms for segments S0-S3, and S5-S7 of bank B0, while the refresh rate for segment S4, at 306, is specified as 1s. The code for bank B1, 01, supercedes the segment S4 code of 11, and thus specifies a refresh rate of 128 ms (shown at 210) for all eight of the segments of bank B1. While FIG. 3 shows a decoder chart that specifies absolute settings with reference to a nominal value, the codes may alternatively represent per-segment multiplier factors to apply to a global refresh setting, such as that associated with a temperature compensated self-refresh scheme (TCSR).

Generally, TCSR provides a way to reduce power consumption while the memory device is operating under self-refresh conditions. The ambient temperature of the memory device is detected by the temperature detection circuitry 132, with global refresh rate changes carried out in response to the detected temperature. The refresh rate increase/decrease generally compensates for increased/decreased leakage rates in the volatile storage cells at different temperatures. In such an embodiment, the temperature detection circuitry 132 detects an operating temperature of the memory device 104, generates corresponding temperature information, and provides the temperature information to the refresh logic 128. The refresh logic may then apply an appropriate global refresh rate setting (stored in the mode register circuitry 130) based on the temperature, and apply per-segment multipliers for non-uniform refresh rates between various segments based on the non-uniform bits stored in the mode register circuitry.

In one embodiment, the memory controller issues auto-refresh commands at the same rate as when NUR is not used. The refresh logic on the DRAM periodically skips execution of a refresh when the refresh counter points to a row in a segment with a longer refresh time assigned by the NUR bits in the mode register. As an example, when the assigned refresh rate for a segment is 128 ms while the memory controller issues auto-refresh commands every 64 ms, the refresh logic skips every second refresh of that segment.

At the memory controller, an alternative form of per-segment refresh may be employed by the auto-refresh controller for auto-refresh operations. As noted above, auto-refresh generally occurs during active operation of an electronic device. With knowledge of acceptable bit error rates for differently allocated areas of memory, variable per-segment refresh rates may be carried out by the auto-refresh controller on the memory controller by, for example, skipping appropriate segments when an external global refresh command is issued.

The memory system, device, and method described above provides finer-granularity per-segment non-uniform refresh that allows for more efficient power savings achievable by the memory system. The embodiments described herein lend themselves well to mobile device applications where power efficiency is a key concern.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

I claim:

1. An integrated circuit (IC) memory device comprising:
    an array of storage cells configured into multiple banks, each bank including multiple segments;
    interface circuitry to receive per-segment values representing per-segment refresh rates, the per-segment values received from a memory controller disposed external to the IC memory device;
    register storage to store the per-segment values; and
    self-refresh logic to refresh each segment in accordance with the corresponding per-segment value during a self-refresh mode of operation.

2. The IC memory device of claim 1, wherein the array of storage cells comprise dynamic random access memory (DRAM) storage cells.

3. The IC memory device of claim 2, wherein the per-segment refresh rates represent refresh rates with reference to a nominal refresh rate.

4. The IC memory device of claim 1, further comprising temperature-compensated refresh circuitry to cooperate with the refresh logic to refresh each segment based on temperature.

5. The IC memory device of claim 4, wherein the per-segment refresh rates represent multiplier values applied to a global temperature-based refresh rate determined by the temperature-compensated refresh circuitry.

6. A method of operation in a memory device, the method comprising:
    storing data in an array of storage cells including multiple banks, each bank including multiple segments;
    receiving with interface circuitry, from a memory controller disposed external to the memory device, per-segment values representing per-segment refresh rates;
    loading the per-segment values in register storage; and
    refreshing each segment, with self-refresh logic during a self-refresh mode of operation, in accordance with the corresponding per-segment value.

7. The method of claim 6, wherein the refreshing comprises:
    refreshing each segment during an auto-refresh operation.

8. The method of claim 6, wherein the storing data is carried out in accordance with a dynamic random access memory (DRAM) protocol.

9. The method of claim 6, wherein the per-segment refresh rates represent refresh rates with reference to a nominal rate.

10. The method of claim 6, further comprising:
    generating temperature-based refresh rates to cooperate with the received per-segment values to refresh each segment based on temperature.

11. The method of claim 10, wherein the per-segment refresh rates represent multiplier values applied to the temperature-based refresh parameters generated by the temperature-compensated refresh circuitry.

12. The method of claim 11, wherein loading the per-segment values in register storage comprises:
    transferring the per-segment values to the register storage in response to a mode register write (MRW) command.

13. An integrated circuit (IC) dynamic random access memory (DRAM) device comprising:
   an array of storage cells configured into multiple banks, each bank including at least a first segment and a second segment;
   an interface to receive a first value representing a first refresh rate for refreshing the first segment, the interface to receive a second value representing a second refresh rate for refreshing the second segment, the first value and the second value received from a memory controller disposed external to the IC DRAM device;
   a mode register to store the first value and the second value; and
   self-refresh logic to refresh the first segment and the second segment in accordance with the corresponding first value and second value during a self-refresh mode of operation.

14. The IC DRAM device of claim 13, wherein:
   the first and second values are free to be different from one another.

15. The IC DRAM device of claim 13, wherein each of the first and second refresh rates represent absolute refresh rates.

16. The IC DRAM device of claim 13, further comprising:
   temperature-compensated refresh circuitry to cooperate with the refresh logic to refresh each segment based on temperature; and
   wherein each of the first and second refresh rates represent multiplier values applied to a global temperature-based refresh rate determined by the temperature-compensated refresh circuitry.

* * * * *